United States Patent
Bae et al.

(10) Patent No.: US 6,642,592 B2
(45) Date of Patent: Nov. 4, 2003

(54) SEMICONDUCTOR DEVICE AND METHOD FOR FABRICATING SAME

(75) Inventors: Jong Uk Bae, Chungcheongbuk-do (KR); Ji Soo Park, Chungcheongbuk-do (KR); Bong Soo Kim, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 10/184,991

(22) Filed: Jul. 1, 2002

(65) Prior Publication Data

US 2002/0164866 A1 Nov. 7, 2002

Related U.S. Application Data

(62) Division of application No. 09/710,840, filed on Nov. 14, 2000, now Pat. No. 6,455,404.

(30) Foreign Application Priority Data

Jul. 22, 2000 (KR) ........................................ 2000-42159

(51) Int. Cl.$^7$ .............................................. H01L 29/76
(52) U.S. Cl. ...................... 257/413; 257/388; 257/412; 438/585; 438/592; 438/595; 438/655; 438/656; 438/651; 438/581; 438/583; 438/682; 438/724
(58) Field of Search .................................. 257/413, 412, 257/388; 438/585, 592, 595, 655, 656, 657, 581, 583, 682, 724

(56) References Cited

U.S. PATENT DOCUMENTS

| 5,567,652 A | 10/1996 | Nishio |
| 5,861,340 A | 1/1999 | Bai et al. |
| 5,869,396 A | 2/1999 | Pan et al. |
| 5,972,785 A | 10/1999 | Shishiguchi et al. |
| 6,037,204 A | 3/2000 | Chang et al. |
| 6,124,177 A | 9/2000 | Lin et al. |
| 6,165,902 A | 12/2000 | Pramanick et al. |

*Primary Examiner*—Caridad Everhart
*Assistant Examiner*—Belur Keshavan
(74) *Attorney, Agent, or Firm*—Morgan, Lewis & Bockius LLP

(57) ABSTRACT

A semiconductor device and method for fabricating the same which improves reliability of the semiconductor device is disclosed. The semiconductor device includes: a first insulating film and a gate electrode sequentially formed on a part of a semiconductor substrate; a first insulating spacer formed at both sides above the gate electrode; a second insulating spacer formed at both sides below the gate electrode; and a cobalt silicide film formed on a surface of the gate electrode at a predetermined depth. The method for fabricating the semiconductor device includes the steps of: forming a first insulating film having a hole to expose a part of a semiconductor substrate; forming a second insulating film on the exposed semiconductor substrate inside the hole; forming a gate electrode on the second insulating film to protrude more than the first insulating film; forming a first insulating spacer at both sides of an upper part of the protruded gate electrode; forming a cobalt silicide on a surface of the upper part of the gate electrode; and selectively removing the first insulating film to remain on both sides of a lower part of the gate electrode, so that a second insulating spacer is formed.

8 Claims, 8 Drawing Sheets

SEMICONDUCTOR DEVICE AND METHOD FOR FABRICATING SAME

This is a divisional of application Ser. No. 09/710,840 filed on Nov. 14, 2000 U.S. Pat. 6,455,404.

BACKGROUND OF THE INVENTION

1. Field of the Invention

The present invention relates to a semiconductor device, and more particularly, to a semiconductor device and method for fabricating the same which improves reliability of the semiconductor device.

2. Background of the Related Art

Generally, with high packing density of a semiconductor device, the size of a gate electrode is gradually reduced in the semiconductor device. Accordingly, specific resistance of the gate electrode increases, thereby reducing operation speed of the device.

In this respect, a manufacture of a gate electrode having low resistivity is essentially required. To this end, a refractory metal silicon of low resistance is used as the gate electrode and it is called a policide(silicide on doped polycrystalline-Si).

A tungsten silicide $WSi_2$ having a resistivity value of 60~200 $\mu\Omega$cm has been widely used, but cobalt silicide ($CoSi_2$) having a resistivity of 15~20 $\mu\Omega$cm has recently received much attention, with high packing density of the device.

However, it is difficult to etch the cobalt silicide ($CoSi_2$) and thus it is difficult to pattern it. For this reason, the cobalt silicide ($CoSi_2$) is difficult to be applied to the policide.

A related art semiconductor device and method for fabricating the same will be described with the accompanying drawings.

FIGS. 1a to 1f are sectional views showing fabricating process steps of the related art semiconductor device.

In a structure of the related art semiconductor device, as shown in FIG. 1f, a gate electrode 13a is formed on a part of a semiconductor substrate 11 and a gate oxide film 12 is interposed between the gate electrode 13a and the semiconductor substrate 11. An insulating spacer 14 is formed at both sides of the gate oxide film 12 and the gate electrode 13a. A cobalt silicide film 17 is formed on a surface of the gate electrode 13a at a predetermined depth.

A method for fabricating the aforementioned related art semiconductor device will be described below.

A device isolation region is formed by local oxidation of silicon (LOCOS) process or shallow trench isolation (STI) process to define an active region and an inactive region (not shown) in the semiconductor substrate 11.

As shown in FIG. 1a, the gate oxide film 12 is formed on the semiconductor substrate 11 of the active region, and a polysilicon film 13 for gate electrode on which impurity ions are doped is deposited on the gate oxide film 12.

Subsequently, as shown in FIG. 1b, the polysilicon film 13 and the gate oxide film 12 are selectively removed by photolithography and etching processes to form the gate electrode 13a on the gate oxide film 12.

A first nitride film is deposited along the surfaces of the semiconductor substrate 11 and the gate electrode 13a. Then, as shown in FIG. 1c, the first nitride film is selectively removed by anisotropic dry-etching process to remain on both sides of the gate electrode 13a and the gate oxide film 12, so that the insulating spacer 14 is formed.

As shown in FIG. 1d, a second nitride film 15 is deposited on an entire surface of the semiconductor substrate 11 including the gate electrode 13a. At this time, instead of the nitride films such as the first and second nitride films, oxide films may be used.

As shown in FIG. 1e, the second nitride film 15 is polished by chemical mechanical polishing (CMP) process to expose the surface of the gate electrode 13a.

Subsequently, a cobalt film 16 is deposited on the entire surface of the semiconductor substrate 11 including the exposed gate electrode 13a.

As shown in FIG. 1f, the cobalt silicide ($CoSi_2$) film 17 is formed on the surface of the gate electrode 13a at a predetermined depth by annealing process. The cobalt silicide ($CoSi_2$) film 17 is formed by reacting cobalt of the cobalt film 16 with silicon of the gate electrode 13a.

Afterwards, the cobalt film 16 on the second nitride film 15, which remains without reacting with silicon, is removed using $H_2SO_4$ solution or HCl solution. The second nitride film 15 is then removed using the cobalt silicide film 17 as a mask to expose the semiconductor substrate 11 at both sides of the gate electrode 13a and the insulating spacer 14.

Finally, source/drain regions (not shown) are formed in the exposed semiconductor substrate 11 at both sides of the insulating spacer 14 at predetermined depths by impurity ion implantation using the cobalt silicide film 17 as a mask. Thus, the related art semiconductor device is completed.

However, the related art semiconductor device and method for fabricating the same has several problems.

In the CMP process for exposing the surface of the gate electrode, the surface of the gate electrode may not be exposed as the CMP process is not completely performed. In this case, the cobalt silicide is not formed. On the other hand, if the CMP process is performed exceedingly, poor lower pattern may be caused. Furthermore, in the etching process of the polysilicon film to pattern the gate electrode, a photolithography process margin is very small. This is likely to cause a poor gate electrode pattern.

SUMMARY OF THE INVENTION

An object of the invention is to solve at least the above problems and/or disadvantages and to provide at least the advantages described hereinafter.

Another object of the present invention is to provide a semiconductor device and method for fabricating the same that substantially obviates one or more of the problems due to limitations and disadvantages of the related art.

Another object of the present invention is to provide a semiconductor device and method for fabricating the same which improves reliability of the semiconductor device.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve at least these objects and other advantages in a whole or in part and in accordance with purposes of the present invention, as embodied and broadly described, a semiconductor device according to the present invention includes: a first insulating film and a gate electrode sequentially formed on a part of a semiconductor substrate; a first insulating spacer formed at both sides above the gate electrode; a second insulating spacer formed at both sides below the gate electrode; and a cobalt silicide film formed on a surface of the gate electrode at a predetermined depth.

In another aspect, a method for fabricating a semiconductor device according to the present invention includes the steps of: forming a first insulating film having a hole to expose a part of a semiconductor substrate; forming a second insulating film on the exposed semiconductor substrate inside the hole; forming a gate electrode on the second insulating film to protrude more than the first insulating film; forming a first insulating spacer at both sides of an upper part of the protruded gate electrode; forming a cobalt silicide on a surface of the upper part of the gate electrode; and selectively removing the first insulating film to remain on both sides of a lower part of the gate electrode, so that a second insulating spacer is formed.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 1A:
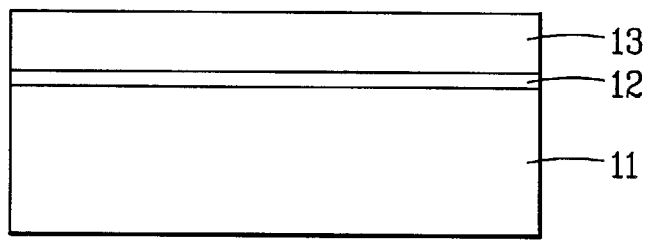
FIGS. 1a to 1f are sectional views showing fabricating process steps of a related art semiconductor device.
Figure 1B:
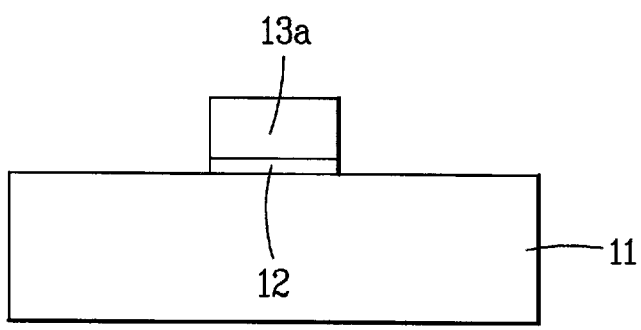
Figure 1C:
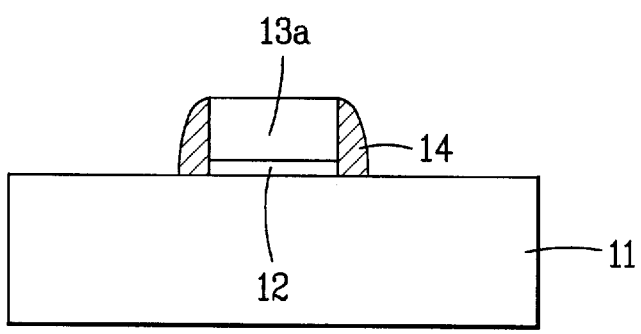
Figure 1D:
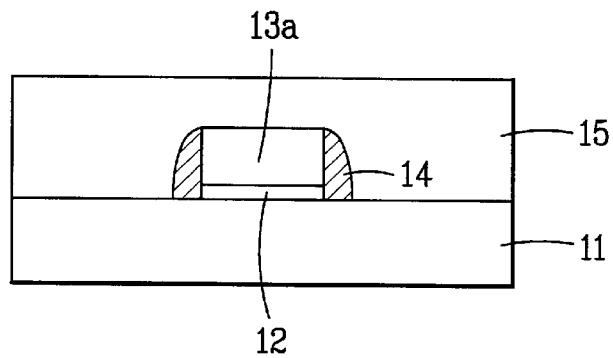
Figure 1E:
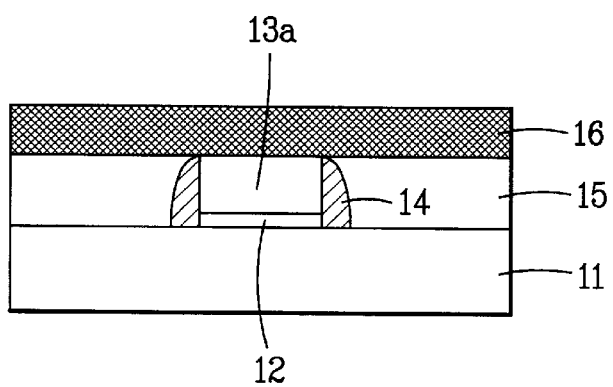
Figure 1F:
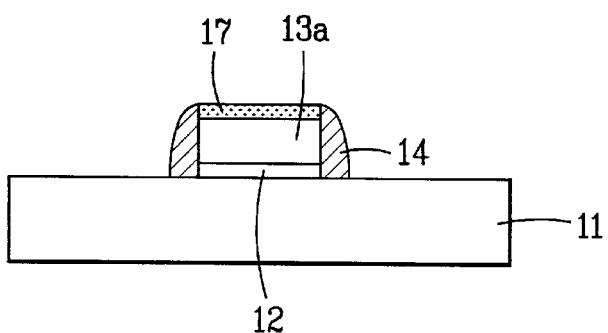
Figure 2A:
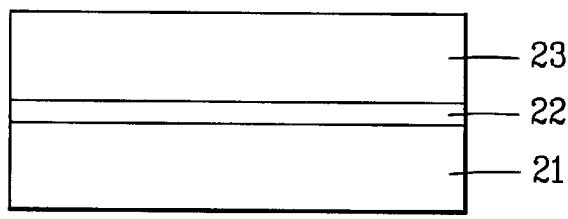
FIGS. 2a to 2i are sectional views showing fabricating process steps of a semiconductor device according to the first embodiment of the present invention.
Figure 2B:
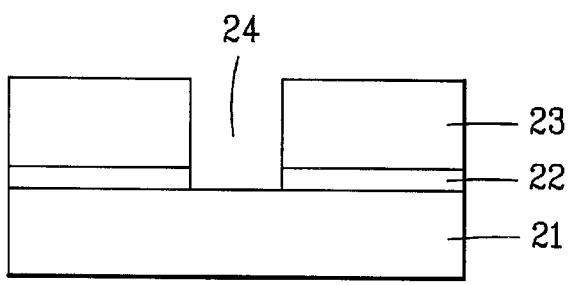
Figure 2C:
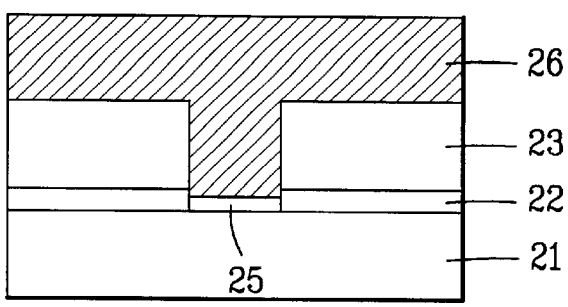
Figure 2D:
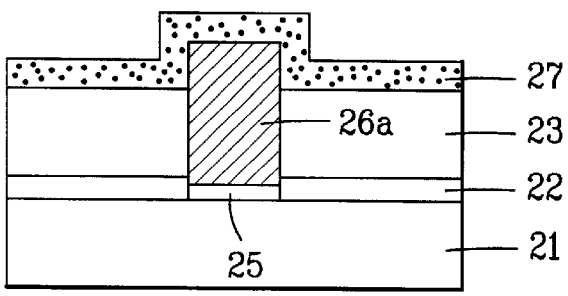
Figure 2E:
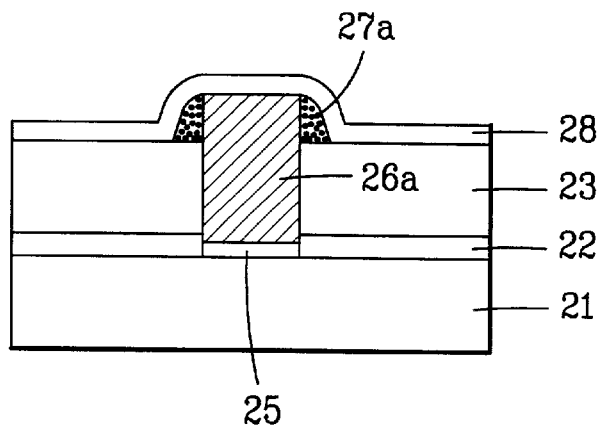
Figure 2F:
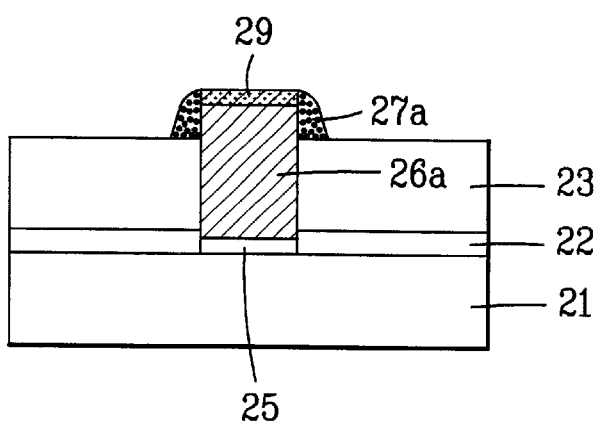
Figure 2G:
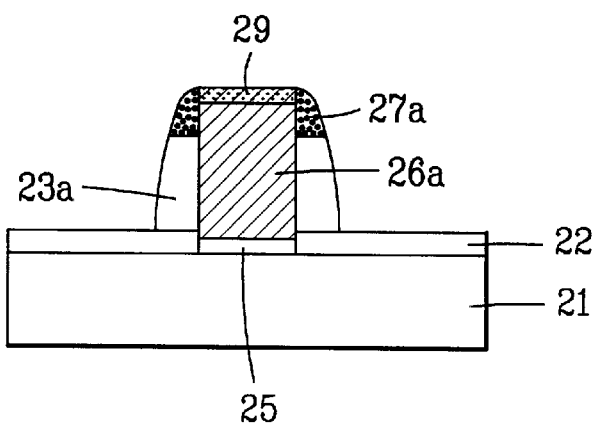

In a structure of a semiconductor device according to the first embodiment of the present invention, as shown in FIG. 2g, an oxide film 22 having a hole to expose a part of a semiconductor substrate 21 is formed on the semiconductor substrate 21, and a gate oxide film 25 is formed on the semiconductor substrate 21 inside the hole at a thickness thinner than the oxide film 22. A gate electrode 26a having a constant height is formed on the gate oxide film 25, and a second insulating spacer 23a is formed on the oxide film 22 at both sides below the gate electrode 26a. A first insulating spacer 27a is formed on the second insulating spacer 23a at both sides above the gate electrode 26a, to be connected with the second insulating spacer 23a. At this time, the first insulating spacer 27a and the second insulating spacer 23a have bell shapes. A cobalt silicide ($CoSi_2$) film 29 is formed on a surface of the gate electrode 26a at a predetermined depth.

A method for fabricating the aforementioned semiconductor device according to the first embodiment of the present invention will be described below.

A device isolation region is formed by LOCOS process or STI process to define an active region and an inactive region (not shown) in the semiconductor substrate 21.

As shown in FIG. 2a, the oxide film 22 is formed on the semiconductor substrate 21 of the active region, and a first nitride film 23 is deposited on the oxide film 22. The oxide film 22 acts as a buffer during ion implantation for forming source/drain regions.

Subsequently, as shown in FIG. 2b, the first nitride film 23 and the oxide film 22 are selectively removed by photolithography and etching processes to partially expose the semiconductor substrate 21, so that a gate formation region 24 is defined.

As shown in FIG. 2c, the gate oxide film 25 is formed on a surface of the exposed semiconductor substrate 21. At this time, the gate oxide film 25 is thinner than the oxide film 22.

A polysilicon film 26 is deposited on the entire surface of the semiconductor substrate 21 including the first nitride film 23.

Then, as shown in FIG. 2d, the polysilicon film 26 is selectively removed by photolithography and etching processes to remain on the gate formation region 24 only, so that the gate electrode 26a is formed. The gate electrode 26a is aligned in one direction together with the gate oxide film 25.

A second nitride film 27 is then deposited along the surfaces of the gate electrode 26a and the first nitride film 23. At this time, instead of the second nitride film, an oxide film may be used.

As shown in FIG. 2e, the second nitride film 27 is removed by anisotropic dry-etching process to remain on both sides of the gate electrode 26a, so that the first insulating spacer 27a is formed.

A cobalt film 28 is then deposited along the surfaces of the first nitride film 23, the first insulating spacer 27a and the gate electrode 26a.

As shown in FIG. 2f, a cobalt silicide (($CoSi_2$) film 29 is formed on the surface of the gate electrode 26a at a predetermined depth by annealing process. The cobalt silicide ($CoSi_2$) film 29 is formed by reacting cobalt of the cobalt film 28 with silicon of the gate electrode 26a.

Afterwards, the cobalt film 28 which remains without reacting with silicon is removed using $H_2SO_4$ solution or HCl solution.

As shown in FIG. 2g, the first nitride film 23 is selectively removed to remain on both sides of the gate electrode 26a, so that the second insulating spacer 23a is formed at both sides of the gate electrode 26a below the first insulating spacer 27a.

Figure 2H:
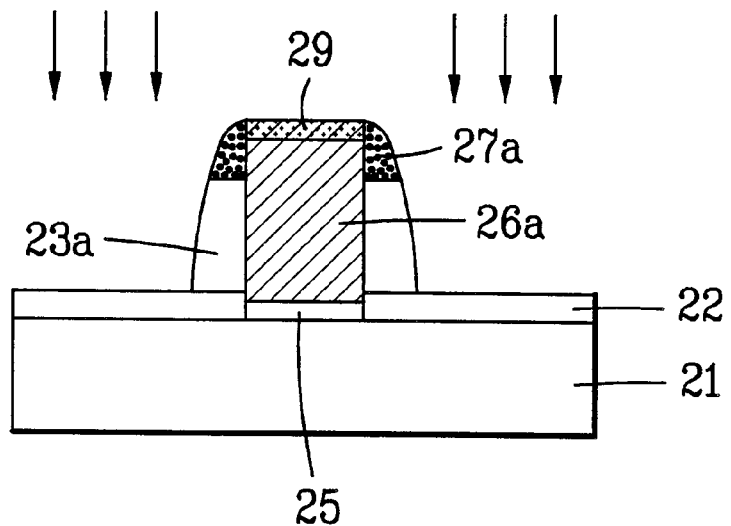
Figure 2I:
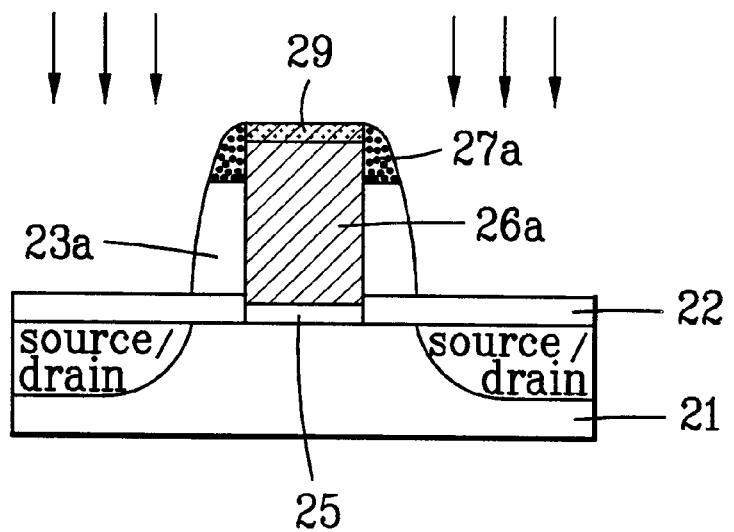

Finally, as shown in FIGS. 2h and 2i source/drain regions (not shown) are formed in the semiconductor substrate 21 at predetermined depths by impurity ion implantation using the cobalt silicide film 29 as a mask. Thus, the semiconductor device according to the first embodiment of the present invention is completed.

Now, a method for fabricating a semiconductor device according to the second embodiment of the present invention will be described. In the second embodiment of the present invention, a photolithography process margin is improved in patterning the gate electrode.

Figure 3A:
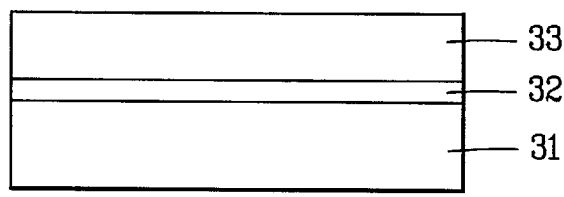
FIGS. 3a to 3i are sectional views showing fabricating process steps of a semiconductor device according to the second embodiment of the present invention.
Figure 3B:
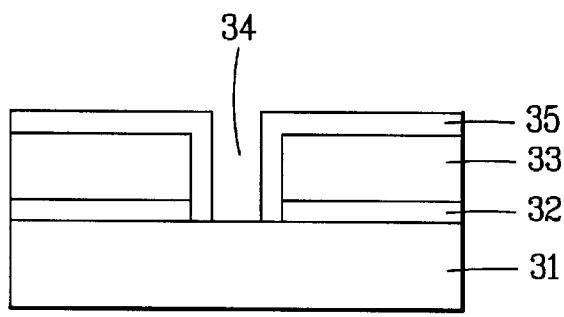
Figure 3C:
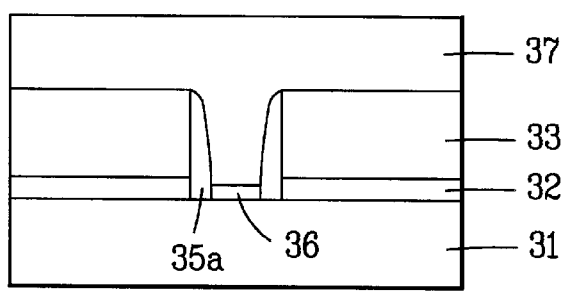
Figure 3D:
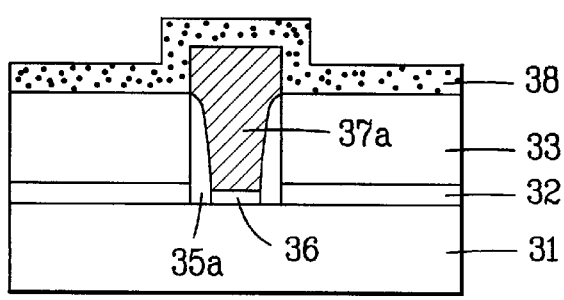
Figure 3E:
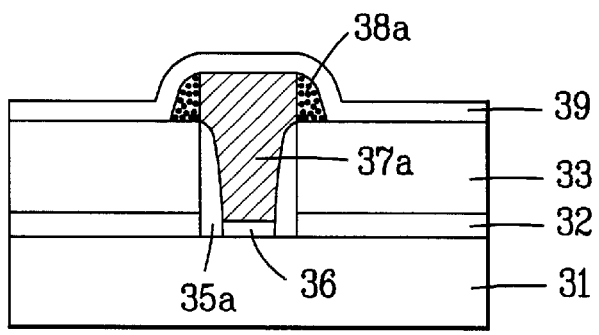
Figure 3F:
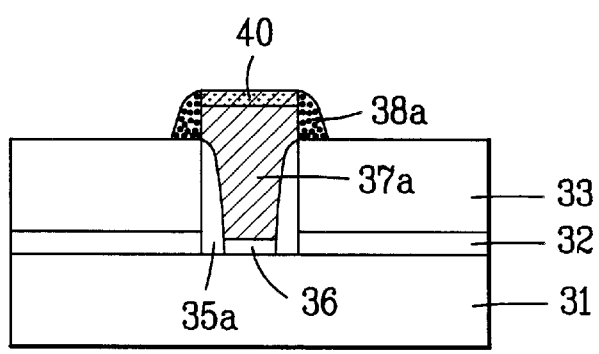
Figure 3G:
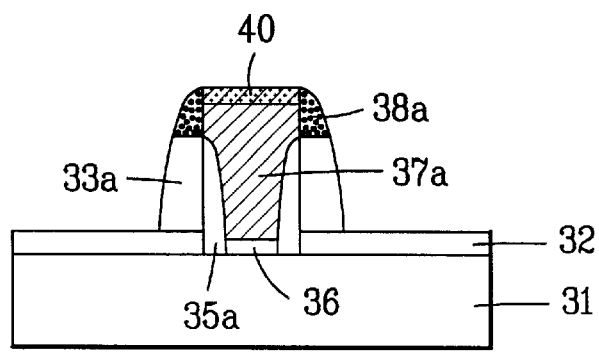

In a structure of the semiconductor device according to the second embodiment of the present invention, as shown in FIG. 3g, a first oxide film 32 having a hole to expose a part of a semiconductor substrate 31 is formed on the semiconductor substrate 31, and a gate electrode 37a which is aligned with the hole is formed on the exposed semiconductor substrate 31. A third insulating spacer 33a is formed at both sides below the gate electrode 37a, and a second insulating spacer 38a is formed on the third insulating spacer 33a at both sides above the gate electrode 37a, to be connected with the third insulating spacer 33a. At this time, the second insulating spacer 38a and the third insulating spacer 33a have bell shapes. A first insulating spacer 35a is formed at a side inside the hole of the third insulating spacer 33a, and a gate oxide film 36 is formed on the semiconductor substrate 31 inside the hole at a side of the first insulating spacer 35a. The gate oxide film 36 is thinner than the first oxide film 32.

The method for fabricating the aforementioned semiconductor device according to the second embodiment of the present invention will be described below.

A device isolation region is formed by LOCOS process or STI process to define an active region and an inactive region (not shown) in the semiconductor substrate 31.

As shown in FIG. 3a, the first oxide film 32 is formed on the semiconductor substrate 31 of the active region, and a first nitride film 33 is deposited on the first oxide film 32. The first oxide film 32 acts as a buffer during ion implantation for forming source/drain regions.

Subsequently, as shown in FIG. 3b, the first nitride film 33 and the first oxide film 32 are selectively removed by photolithography and etching processes to partially expose the semiconductor substrate 31, so that a gate formation region 34 is defined. The second oxide film 35 is then deposited along a surface of the first nitride film 33.

As shown in FIG. 3c, the second oxide film 35 is removed by anisotropic dry-etching process to remain on both sides of the first nitride film 33 inside the gate formation region 34, so that the first insulating spacer 35a is formed.

Subsequently, the gate oxide film 36 is formed on a surface of the exposed semiconductor substrate 31. At this time, the gate oxide film 36 is thinner than the first oxide fin 32.

A polysilicon film 37 is deposited on the entire surface of the semiconductor substrate 31 including the first nitride film 33.

Then, as shown in FIG. 3d, the polysilicon film 37 on the first nitride film 33 is removed by photolithography and etching processes to remain on the gate formation region 34 only, so that the gate electrode 37a is formed on the gate oxide film 36. The gate electrode 37a is aligned in one direction together with the gate formation region 34.

A second nitride film 38 is then deposited along the surfaces of the gate electrode 37a and the first nitride film 33. At this time, instead of the second nitride film 38, an oxide film may be used.

As shown in FIG. 3e, the second nitride film 38 is selectively removed by anisotropic dry-etching process to remain on both sides of the gate electrode 37a, so that the second insulating spacer 38a is formed.

A cobalt film 39 is then deposited along the surfaces of the first nitride film 33, the second insulating spacer 38a and the gate electrode 37a.

As shown in FIG. 3f, a cobalt silicide (CoSi$_2$) film 40 is formed on the surface of the gate electrode 37a at a predetermined depth by annealing process. The cobalt silicide (CoSi$_2$) film 40 is formed by reacting cobalt of the cobalt film 39 with silicon of the gate electrode 37a.

Afterwards, the cobalt film 39 which remains without reacting with silicon is removed using H$_2$SO$_4$ solution or HCl solution.

As shown in FIG. 3g, the first nitride film 33 is selectively removed to remain on both sides of the gate electrode 37a, so that the third insulating spacer 33a is formed.

Figure 3H:
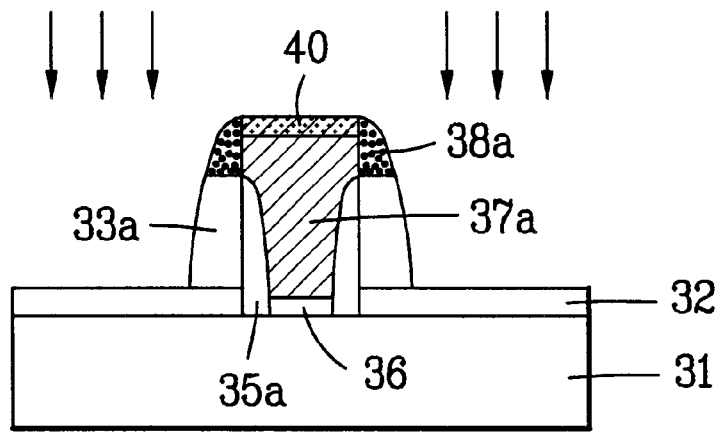
Figure 3I:
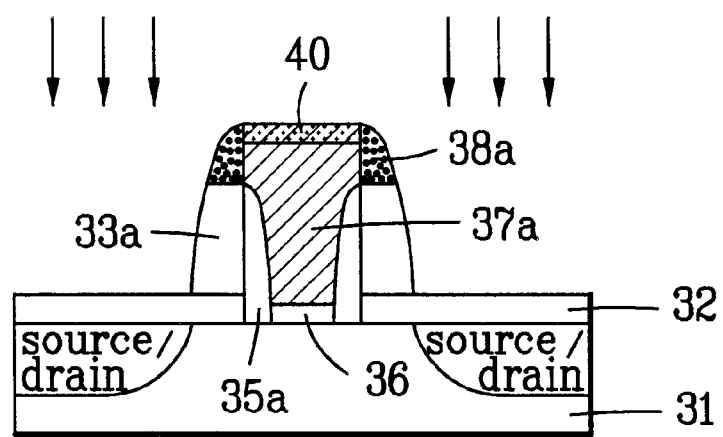

Finally, as shown in FIGS. 3h and 3i source/drain regions (not shown) are formed in the semiconductor substrate 31 at predetermined depths by impurity ion implantation using the cobalt silicide film 40 as a mask. Thus, the semiconductor device according to the second embodiment of the present invention is completed.

As aforementioned, the aforementioned semiconductor device and method for fabricating the same according to the present invention has the following advantages.

First, since the policide gate is formed without CMP process, any error caused by the CMP process is avoided, thereby improving reliability of the device. Furthermore, it is possible to improve a photolithography process margin during patterning process of the gate electrode by forming the insulating spacer inside the hole after etching the nitride film.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device comprising:
    a first insulating film and a gate electrode sequentially formed on a part of a semiconductor substrate;
    a first insulating spacer formed at both sides above the gate electrode;
    a second insulating spacer formed at both sides below the gate electrode; and
    a cobalt silicide film formed on a surface of the gate electrode at a predetermined depth.

2. The semiconductor device of claim 1, further comprising a third insulating spacer formed at a side of the second insulating spacer in the interface between the second insulating spacer and the gate electrode.

3. The semiconductor device of claim 1, further comprising a second insulating film formed on the semiconductor substrate on which the first insulating film is not formed, at a thickness thinner than the first insulating film.

4. The semiconductor device of claim 3, wherein the second insulating film is an oxide film.

5. The semiconductor device of claim 1, wherein the first insulating spacer is either an oxide film or a nitride film.

6. The semiconductor device of claim 1, wherein the second insulating spacer is a nitride film.

7. The semiconductor device of claim 1, wherein the first insulating film is an oxide film.

8. The semiconductor device of claim 1, wherein the second insulating spacer is connected with the first insulating spacer to have a bell shape.

* * * * *